US012765295B2

(12) United States Patent
Yeom et al.

(10) Patent No.: US 12,765,295 B2
(45) Date of Patent: Oct. 13, 2026

(54) METHOD FOR DRY ETCHING USING PLASMA

(71) Applicant: Research & Business Foundation SUNGKYUNKWAN UNIVERSITY, Suwon-si (KR)

(72) Inventors: Geun Young Yeom, Seoul (KR); Hee Ju Kim, Seoul (KR); Goong Soo Nam, Suwon-si (KR)

(73) Assignee: RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 341 days.

(21) Appl. No.: 18/737,445

(22) Filed: Jun. 7, 2024

(65) Prior Publication Data

US 2024/0412979 A1 Dec. 12, 2024

(30) Foreign Application Priority Data

Jun. 9, 2023 (KR) ........................ 10-2023-0074313
Jun. 13, 2023 (KR) ........................ 10-2023-0075365

(51) Int. Cl.

*H10P 50/28* (2026.01)
*H01J 37/32* (2006.01)
*H10P 50/24* (2026.01)
*H10P 76/20* (2026.01)

(52) U.S. Cl.

CPC ...... *H10P 50/283* (2026.01); *H01J 37/32146* (2013.01); *H01J 37/32174* (2013.01); *H10P 50/242* (2026.01); *H10P 76/204* (2026.01); *H01J 2237/3346* (2013.01)

(58) Field of Classification Search

None
See application file for complete search history.

(56) References Cited

U.S. PATENT DOCUMENTS 12,416,863 B2 * 9/2025 Dai ........................... G03F 7/36
2024/0096596 A1 * 3/2024 Yeom ........................ G03F 7/36

FOREIGN PATENT DOCUMENTS

KR 10-2021-0040244 A 4/2021
KR 20210060455 5/2021
KR 10-2022-0137082 A 10/2022
KR 10-2023-0029977 A 3/2023
KR 20230029977 3/2023

OTHER PUBLICATIONS

KIPO, Office Action of KR 10-2023-0074313 dated Mar. 31, 2026, total 7 pages.
Korean Office Action issued on Oct. 28, 2024, in counterpart Korean Patent Application No. 10-2023-0075365 (5 pages in English, 5 pages in Korean).

* cited by examiner

*Primary Examiner* — Roberts P Culbert
(74) *Attorney, Agent, or Firm* — LEX IP MEISTER, PLLC

(57) ABSTRACT

The disclosure provides a plasma dry etching method. A plasma dry etching method according to an embodiment of the disclosure may include: a first step of placing a substrate having a photoresist pattern formed thereon, which is composed of an exposed portion and a non-exposed portion, on an electrode inside a reaction chamber of a plasma dry etching device; a second step of modifying the surface of the photoresist pattern through a plasma deposition process using a first gas; and a third step of selectively etching the non-exposed portion of the surface-modified photoresist pattern through a plasma dry etching process using a second gas.

22 Claims, 13 Drawing Sheets

【FIG. 1】
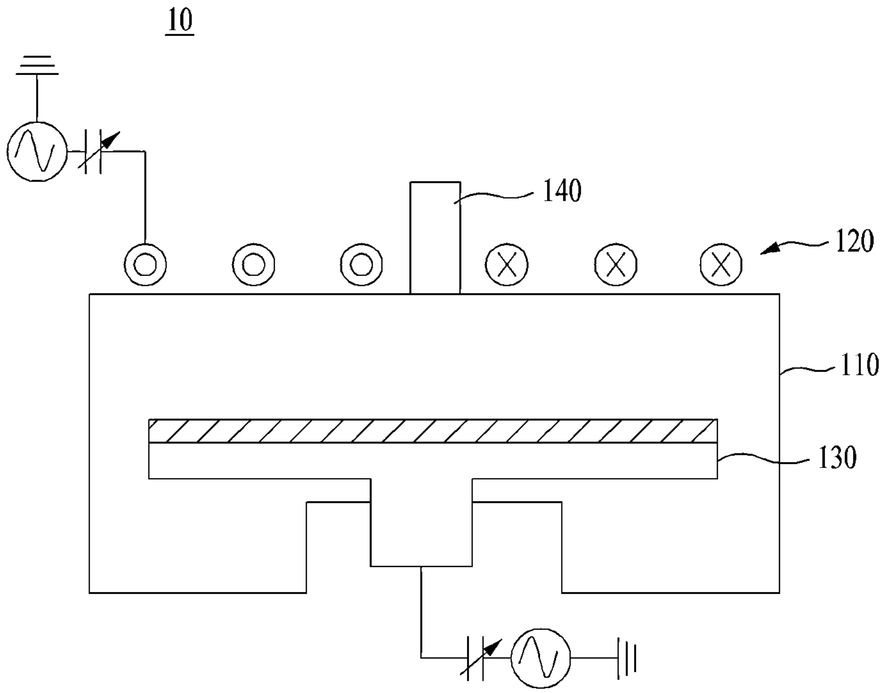

【FIG. 2】
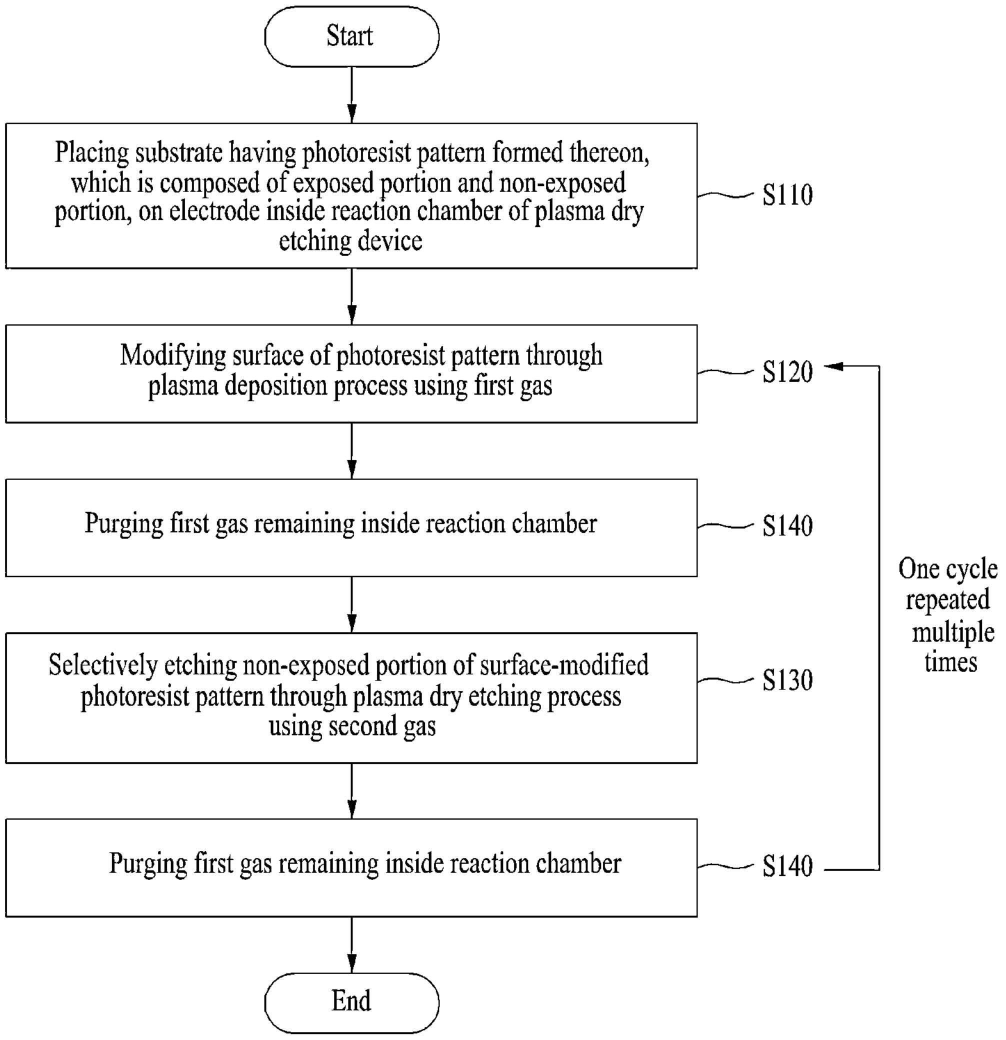

【FIG. 3】
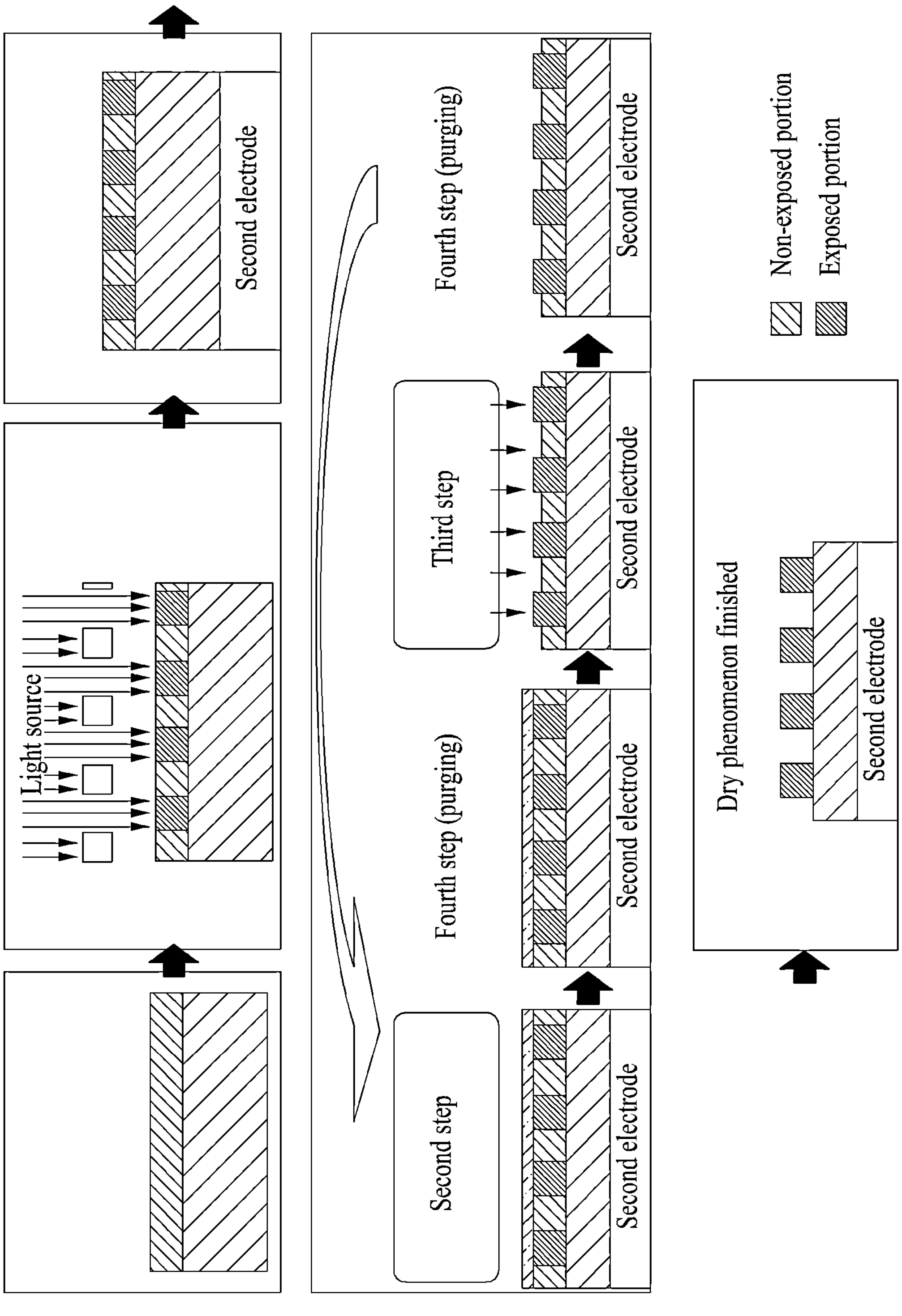

【FIG. 4A】
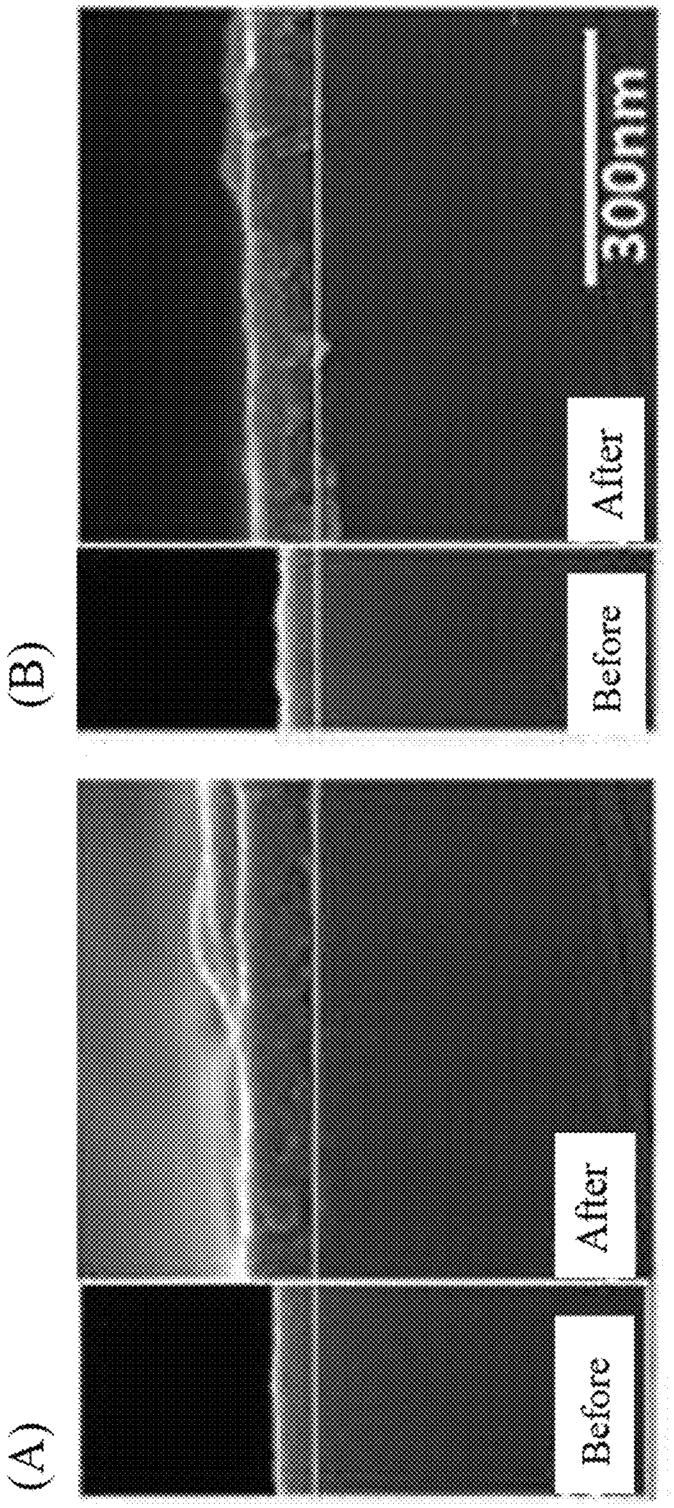

【FIG. 4B】
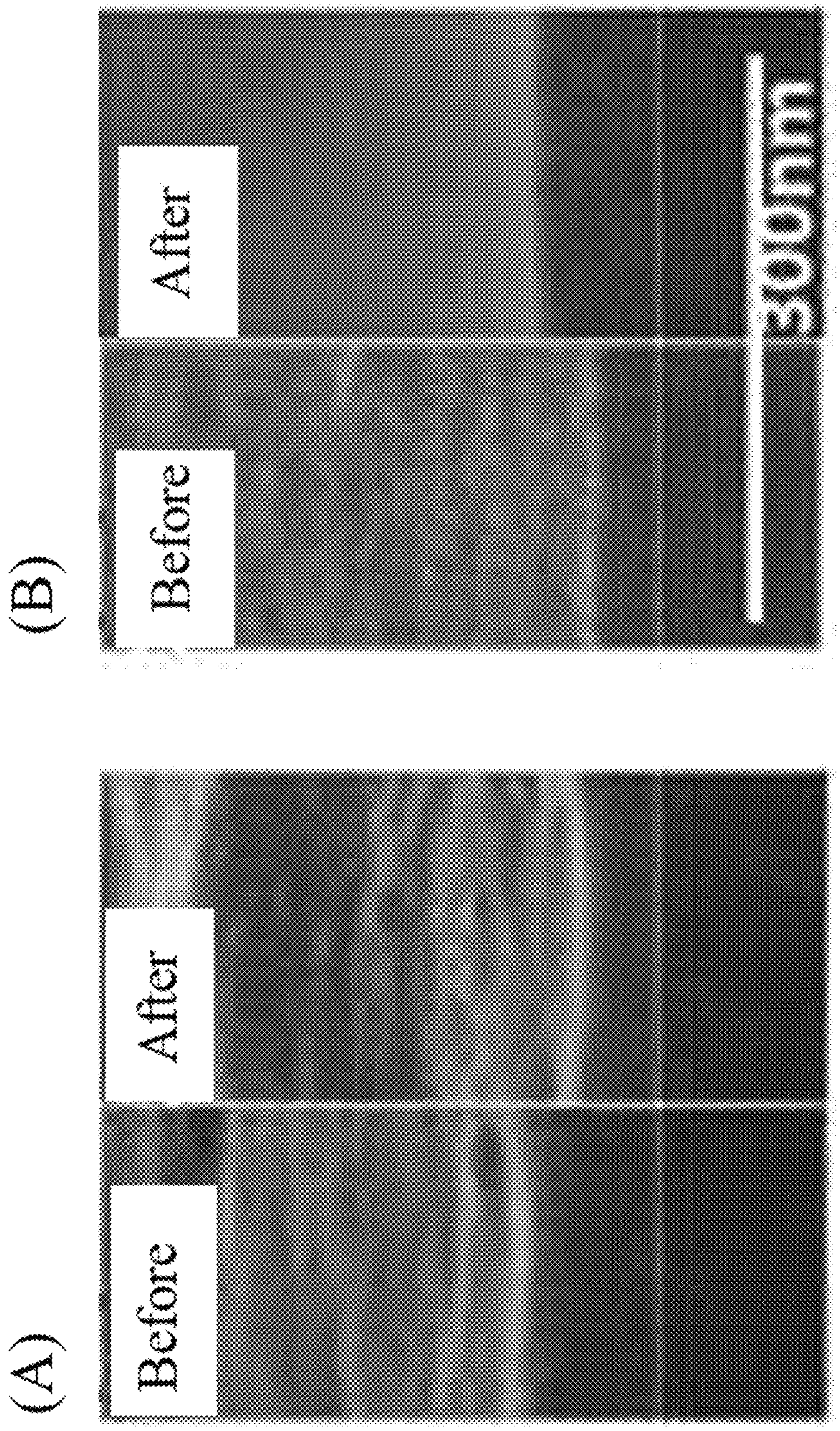

【FIG. 4C】
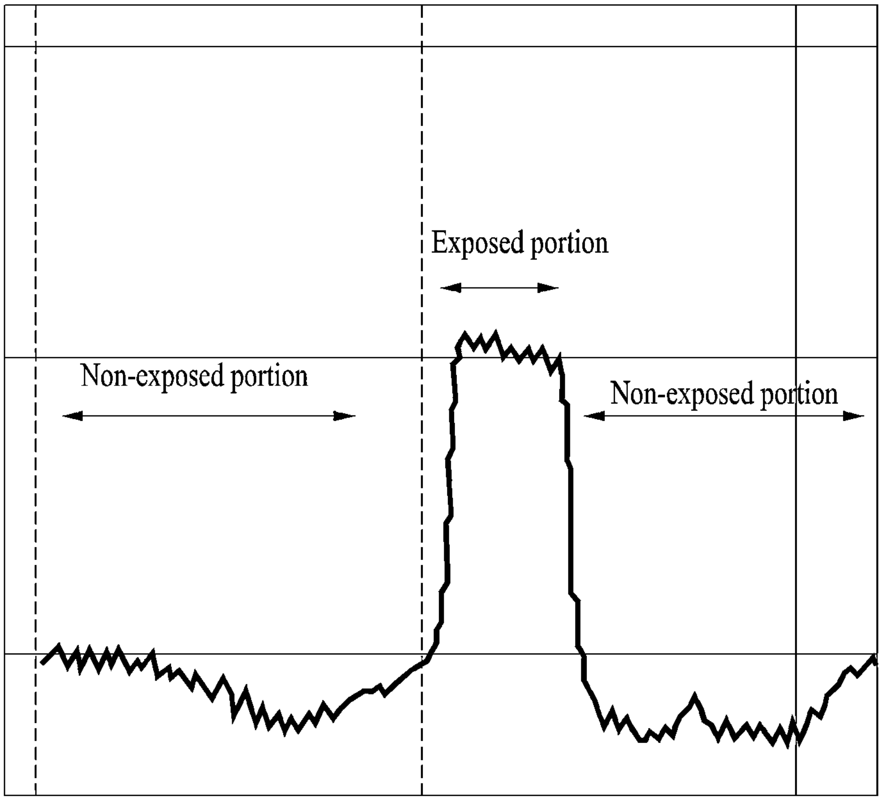

【FIG. 5】
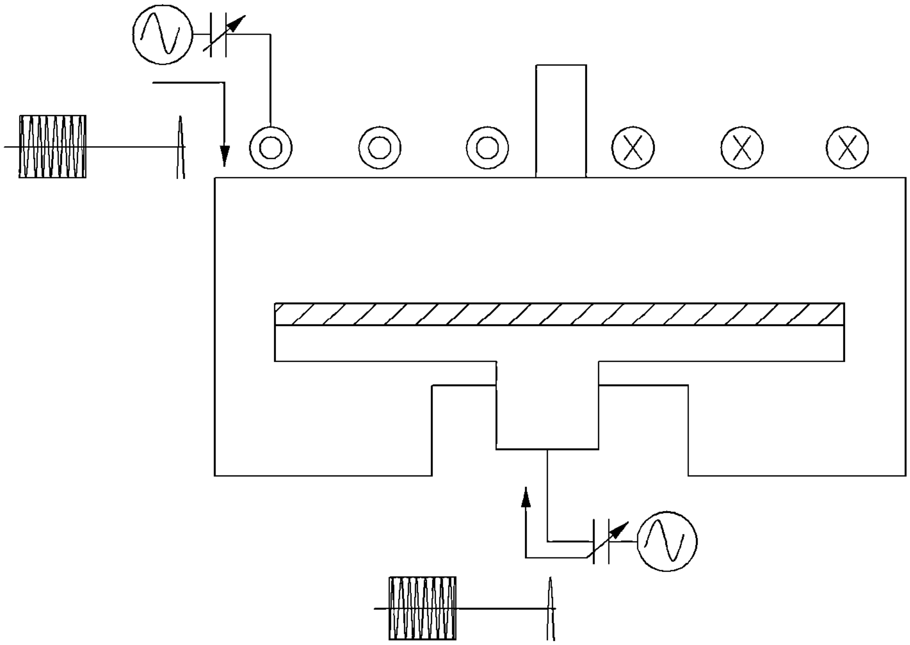

【FIG. 6】
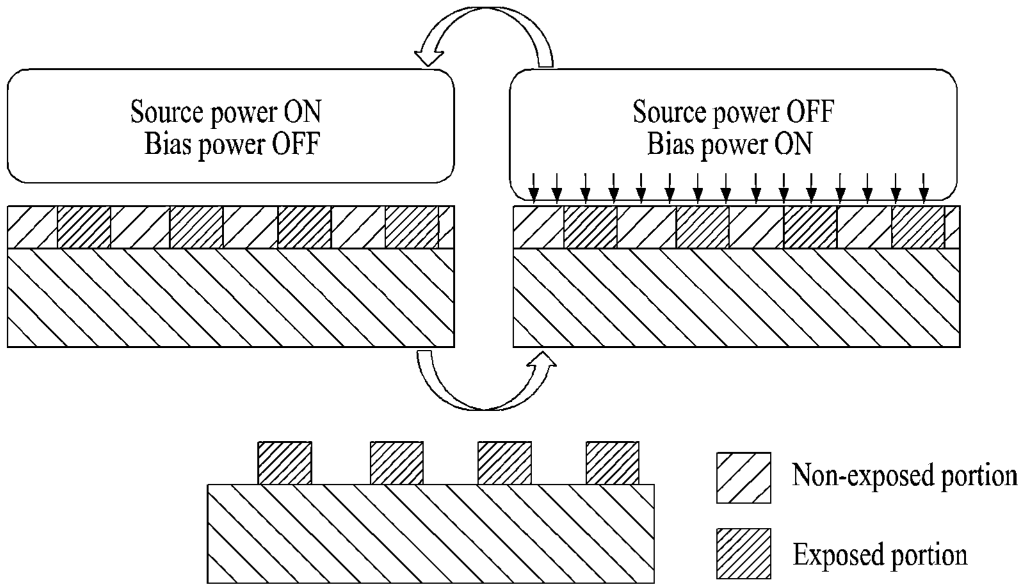

【FIG. 7A】
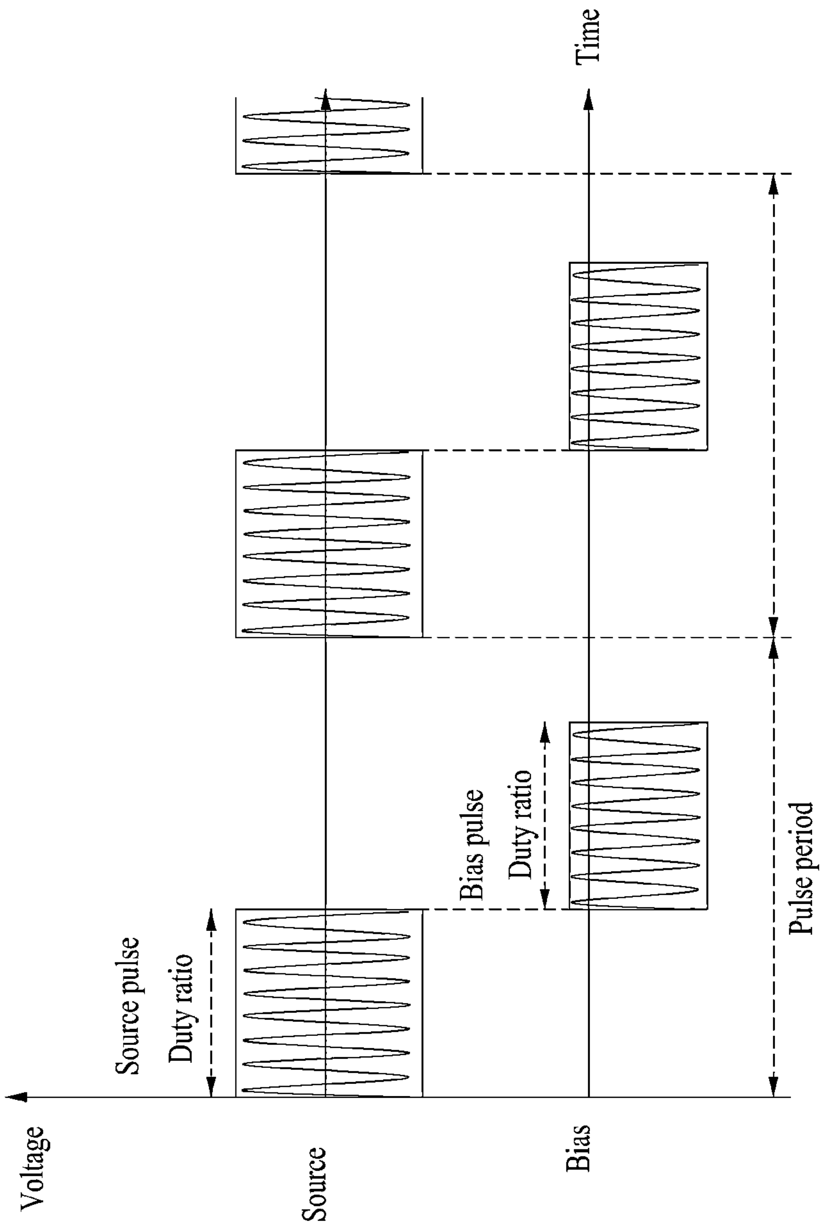

【FIG. 7B】
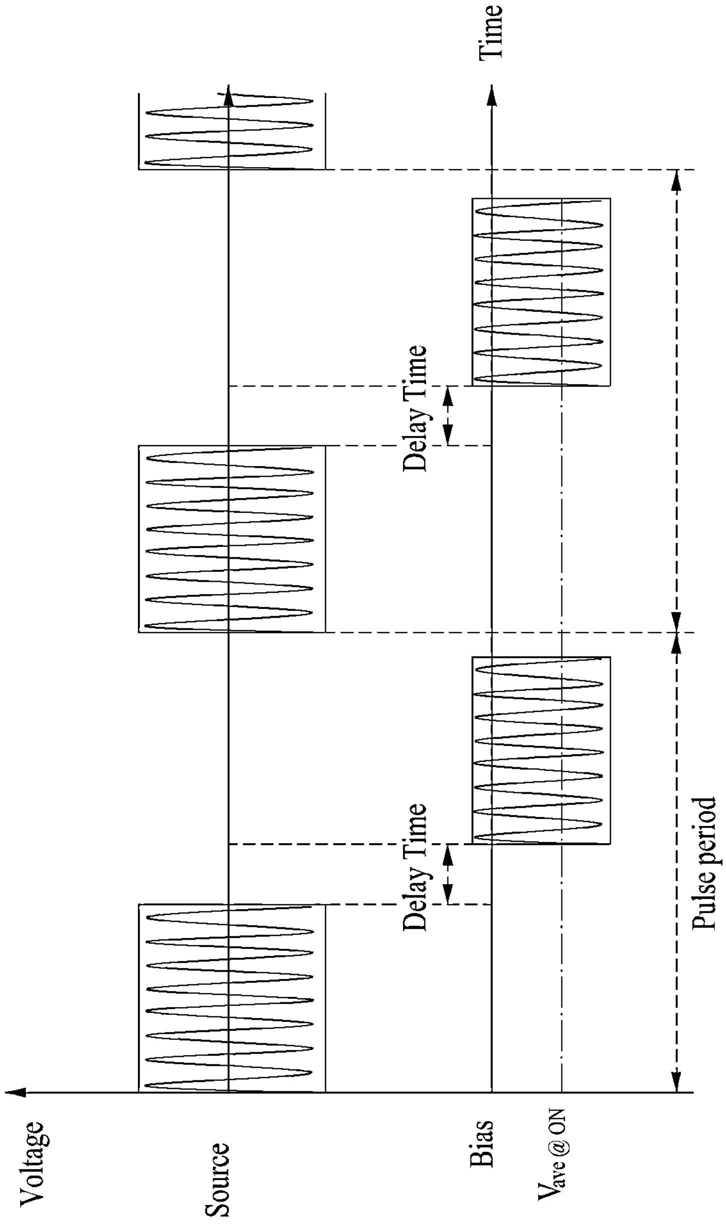

【FIG. 8】
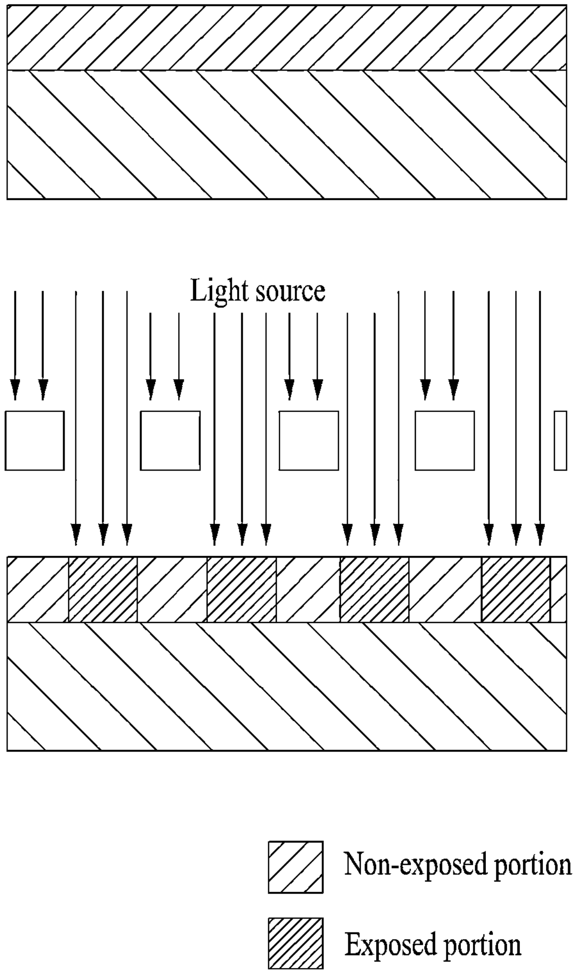

【FIG. 9A】
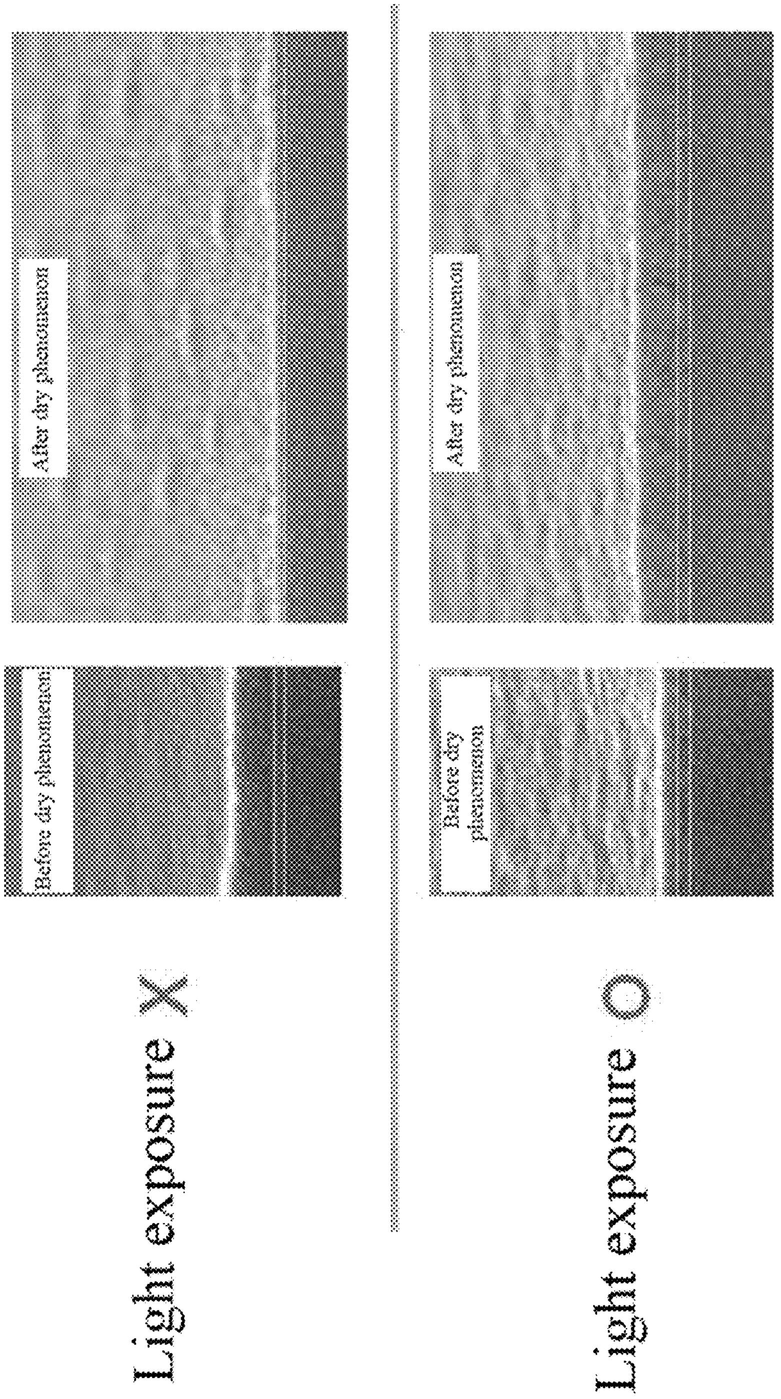

【FIG. 9B】
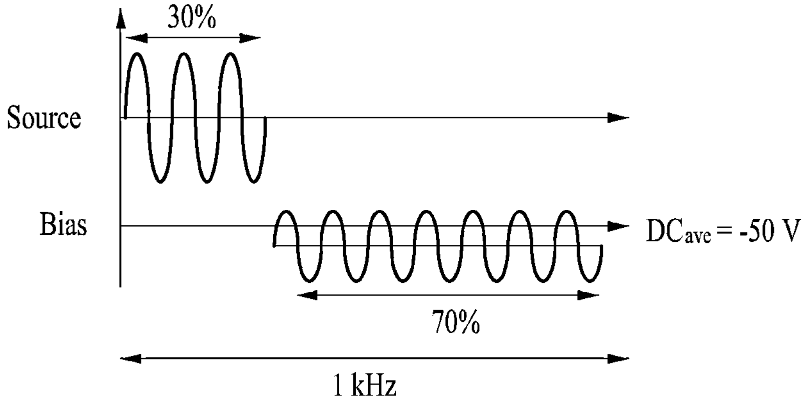
【FIG. 10】
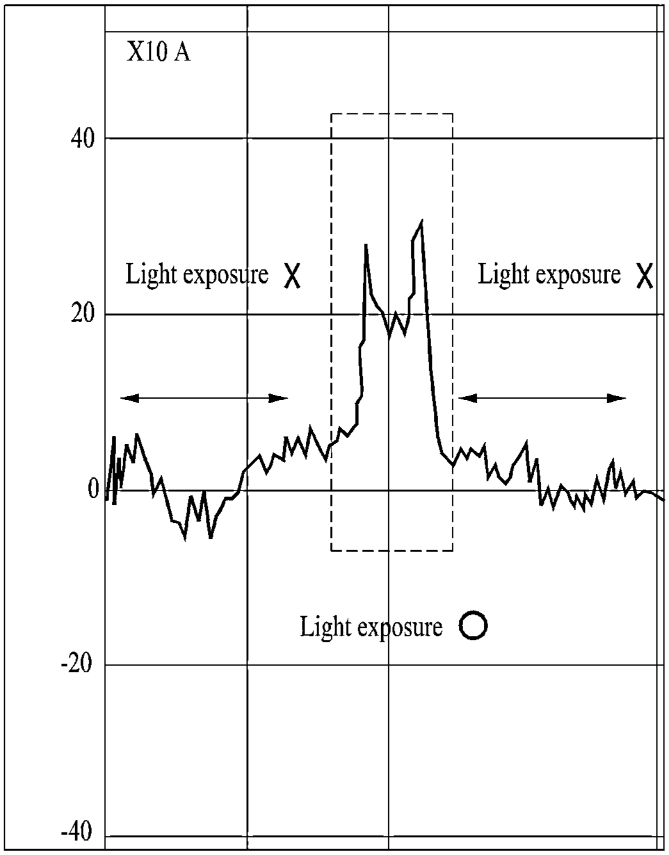

METHOD FOR DRY ETCHING USING PLASMA

CROSS REFERENCE TO RELATED APPLICATION

The present application claims priority to Korean Patent Application No. 10-2023-0074313, filed Jun. 9, 2023, and Korean Patent Application No. 2. 10-2023-0075365, filed Jun. 13, 2023, the entire contents of which is incorporated herein for all purposes by this reference.

BACKGROUND

The disclosure relates to a plasma dry etching method capable of implementing a nano-scale photoresist pattern and a dry etching method using pulse plasma, and more specifically, to a dry etching method for selectively etching only a non-exposed portion by exposing a substrate on which a photoresist pattern composed of an exposed portion and a non-exposed portion is formed to pulse plasma.

In semiconductor processes, due to the miniaturization of the pattern critical dimension (CD) of semiconductor devices, the implementation of nanometer-level patterns in the patterning process has become necessary. In the existing photolithography process, thick organic photoresist (PR) is used and the photoresist pattern is formed through wet development, but this process is difficult to implement a pattern less than about 30 nm. In addition, due to the thick thickness and the shrinking critical dimension, the aspect ratio increases, and there is a problem that the pattern collapses due to capillary force during the development process during the wet development process.

In addition, in the case of the wet etching process, as the pattern becomes finer, the etching solution penetrates into the pattern due to surface tension, making it difficult to implement a nanometer-level pattern.

SUMMARY

An aspect of the disclosure is to provide a plasma dry etching method capable of implementing a nano-scale photoresist pattern by enabling high-selectivity dry development.

Another aspect of the disclosure is to provide a dry etching method using pulse plasma, wherein it is possible to prevent a pattern collapse phenomenon of a nano-pattern due to surface tension that may occur during a wet development process.

Another aspect of the disclosure is to provide a dry etching method capable of forming a negative tone pattern or positive tone pattern by selectively removing a non-exposed or exposed portion by light, electron, x-ray.

According to an aspect of the disclosure, a plasma dry etching method includes: a first step of placing a substrate having a photoresist pattern formed thereon, which is composed of an exposed portion and a non-exposed portion, on an electrode inside a reaction chamber of a plasma dry etching device; a second step of modifying the surface of the photoresist pattern through a plasma deposition process using a first gas; and a third step of selectively etching the non-exposed portion or exposed portion of the surface-modified photoresist pattern through a plasma dry etching process using a second gas.

In an embodiment, the first gas may include a reactive gas comprising at least one selected from the group consisting of chlorine compounds, HBr, fluorine compounds, fluorocarbon compounds, hydrogen, $NH_3$, oxygen, and nitrogen.

In an embodiment, the chlorine compound may include at least one selected from the group consisting of HCl, $CCl_4$, $BCl_3$, $Cl_2$, and $SlCl_4$, the fluorine compound comprises at least one selected from the group consisting of $ClF_3$, $PF_3$/$PF_5$, $IF_5$/$IF_7$, $F_2$, $SF_6$, $NF_3$, and $OF_2$, and the fluorocarbon compound is represented by CxFyHz (x is an integer from 1 to 6, y is an integer from 4 to 8, and z is an integer from 0 to 4).

In an embodiment, the reactive gas may be supplied into the reaction chamber together with an inert gas.

In an embodiment, the second gas comprises an inert gas including at least one selected from the group consisting of He, Ar, Kr, Xe and Ne.

In an embodiment, the third step may include a process of supplying the second gas into the reaction chamber to generate plasma ions and applying a voltage to an electrode on which a substrate is placed to selectively etch a non-exposed portion of a surface-modified photoresist pattern through the plasma ions.

In an embodiment, in the third step, a direct current (DC) voltage of −1 V to −100 V or an RF self-bias voltage of −1 V to −100 V is applied to the electrode on which the substrate is placed.

In an embodiment, in the second and third steps, the temperature of the substrate may be maintained at −50° C. or higher and 150° C. or lower.

In an embodiment, the method may further include a fourth step of purging the first gas remaining inside the reaction chamber after the second step or the third step.

In an embodiment, a cycle composed of the second to fourth steps may be performed multiple times.

According to an aspect of the disclosure, a dry etching method using a pulse plasma device including a vacuum chamber, an upper electrode positioned inside the vacuum chamber and connected to a high-frequency source power, and a lower electrode positioned spaced apart from the upper electrode and connected to a bias power includes: a first step of positioning a substrate on which a photoresist pattern composed of an exposed portion and a non-exposed portion is formed on the lower electrode; a second step of injecting a plasma reaction gas into the vacuum chamber; and a third step of applying a pulse signal of a first AC voltage and a pulse signal of a second AC or DC voltage synchronized with each other to the upper electrode and the lower electrode, respectively, to form a pulse plasma inside the vacuum chamber to selectively etch a non-exposed portion of the photoresist pattern of the substrate.

At this time, the pulse signal of the first AC voltage may have a first application period composed of a first ON time and a first OFF time, the pulse signal of the second AC or DC voltage may have a second application period composed of a second ON time and a second OFF time, and an operation delay time between the first ON time of the pulse signal of the first AC voltage and the second ON time of the pulse signal of the second AC or DC voltage may be 0 to 100 seconds.

In an embodiment, the first application period of the pulse signal of the first AC voltage and the second application period of the pulse signal of the second AC or DC voltage may be the same, the second ON time may be at least a part of the first OFF time, and the first ON time may be at least a part of the second OFF time.

In an embodiment, an operation ratio of the pulse signal of the first AC voltage may be 1 to 100%, and an operation ratio of the pulse signal of the second AC or DC voltage may be 1 to 100%.

In an embodiment, an operation ratio of the pulse signal of the first AC voltage may be 20 to 40%, and an operation ratio of the pulse signal of the second AC or DC voltage may be 40 to 80%.

In an embodiment, the frequency of the pulse signal of the first AC voltage and the pulse signal of the second AC or DC voltage may be 0.01 Hz to 100 KHz.

In an embodiment, the frequency of the first AC voltage may be 2 MHz to 100 MHz, and the frequency of the second AC or DC voltage may be 400 kHz to 60 MHz.

In an embodiment, a plasma generating device may generate any one plasma selected from the group consisting of inductively coupled plasma (ICP), capacitively coupled plasma (CCP), and electron cyclotron resonance (ECR) plasma.

In an embodiment, the bias power may be a DC or RF power.

In an embodiment, a self-bias voltage of the pulse signal of the second AC or DC voltage may be −1 to −200 V.

In an embodiment, the high frequency source power may be 1 W to 5 KW, and the bias power may be 1 W to 300 W.

In an embodiment, the reaction gas may be one selected from the group consisting of HBr, $BCl_3$, $Cl_2$, $O_2$, $ClF_3$, $H_2$, $N_2$, Ar, He, Ne, Kr, and $C_xF_yH_z$ (x is a natural number from 1 to 6, y is a natural number from 4 to 8, and z is a natural number from 1 to 4).

In an embodiment, in the third step, when the pulse signal of the first AC voltage is the first ON time and the pulse signal of the second AC or DC voltage is the second OFF time, radical ions generated by the plasma may be adsorbed on the non-exposed portion of the photoresist pattern of the substrate, and when the pulse signal of the first AC voltage is the first OFF time and the pulse signal of the second AC or DC voltage is the second ON time, the ions of the non-exposed portion may be desorbed and the non-exposed portion is etched.

According to the plasma dry etching method of the disclosure, collapse due to surface tension and capillary force that may occur in the wet phenomenon when forming a nano-scale pattern may be prevented, and surface roughness or the like may be improved through precise reaction and removal of the reaction layer. In addition, the disclosure enables high-selectivity dry phenomenon through plasma dry etching, so that nano-scale photoresist pattern implementation is possible.

According to the disclosure, collapse due to surface tension and capillary phenomenon that may occur in a wet phenomenon of a nano-scale pattern may be prevented, surface roughness or the like may be improved through precise etching reaction and removal of the etching target layer, a faster process is possible compared to conventional technologies, and a high-selectivity dry etching phenomenon is also possible.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 1 is a view showing a device for a plasma dry etching method according to an embodiment of the disclosure;

FIG. 2 is a flow chart showing a plasma dry etching method according to an embodiment of the disclosure;

FIG. 3 is a view for explaining a plasma dry etching method according to an embodiment of the disclosure;

FIG. 4A shows an optical microscope image of a photoresist pattern before/after a plasma deposition process in a plasma dry etching method according to an embodiment of the disclosure ((a) non-exposed portion, (b) exposed portion);

FIG. 4B shows an optical microscope image of a photoresist pattern before/after a plasma dry etching process ((a) non-exposed portion, (b) exposed portion);

FIG. 4C shows the result of performing the plasma deposition process and the plasma dry etching process repeatedly several times;

FIG. 5 is a view showing a pulse plasma device according to the disclosure;

FIGS. 6 and 7 are drawings for explaining a dry etching method using a pulse plasma device according to the disclosure;

FIG. 8 is a view for explaining a substrate on which a photoresist pattern composed of an exposed portion and a non-exposed portion is formed according to an embodiment of the disclosure; and FIGS. 9 and 10 are drawings showing experimental results of performing dry etching using the dry etching method of the disclosure.

DETAILED DESCRIPTION

Hereinafter, the disclosure will be described with reference to the accompanying drawings. The disclosure may be implemented in various different forms and, therefore, is not limited to the embodiments described herein. However, this is not intended to limit the disclosure to a specific disclosure form, and it should be understood that this includes all modifications, equivalents, or alternatives included in the spirit and technical scope of the disclosure. In describing each drawing, similar reference numerals are used for similar components.

The terms used herein are merely used to describe specific embodiments and are not intended to limit the disclosure. Singular expressions include plural expressions unless the context clearly dictates otherwise. In this specification, it should be understood terms such as “include” or “have” are to designate the presence of features, numbers, steps, operations, components, parts, or combinations thereof described in the specification, but are not to exclude in advance the possibility of the presence or addition of one or more other features, numbers, steps, operations, components, parts, or combinations thereof.

Unless otherwise defined, all terms used herein, including technical or scientific terms, have the same meaning as commonly understood by a person of ordinary skill in the art to which this disclosure belongs. Terms defined in commonly used dictionaries should be interpreted as having a meaning consistent with their meaning in the context of the relevant art, and shall not be interpreted in an idealized or overly formal sense unless explicitly defined in this application.

FIGS. 1 to 3 are views for explaining a plasma dry etching method according to an embodiment of the disclosure.

Referring to FIG. 1, the plasma dry etching method of the disclosure is characterized by using a plasma dry etching device 10. A first electrode 120 for discharging a first gas or a second gas is formed outside (or inside) a reaction chamber 110 of the plasma dry etching device 10, and an etching target is placed inside the reaction chamber 110, and a second electrode 130 for applying a voltage to perform dry etching through plasma ions may be formed. The first gas or the second gas may be supplied into the reaction chamber through a gas supply unit 140. Various plasma species including ions, electrons, and radicals may be generated inside the reaction chamber 110. The disclosure is characterized in that a plasma deposition process is performed using a first gas, and a plasma dry etching process is performed using a second gas.

More specifically, referring to FIGS. 2 and 3, a plasma dry etching method according to an embodiment of the disclosure may include: a first step (S110) of placing a substrate having a photoresist pattern formed thereon, which is composed of an exposed portion and a non-exposed portion, on an electrode inside a reaction chamber of a plasma dry etching device; a second step (S120) of modifying the surface of the photoresist pattern through a plasma deposition process using a first gas; and a third step (S130) of selectively etching the non-exposed portion of the surface-modified photoresist pattern through a plasma dry etching process using a second gas.

The first step (S110) may include a step of placing a substrate on which a photoresist pattern formed of an exposed portion and a non-exposed portion is formed, on an electrode inside a reaction chamber of a plasma dry etching device.

In an embodiment, the photoresist pattern may be formed on the substrate through the following steps.

First, a step of depositing or coating a photosensitive photoresist on the substrate may be performed. Here, the photosensitive photoresist is not particularly limited, and for example, a known photosensitive photoresist such as a metal organic cluster photoresist (metal=Sn, Zn, Zr, Hf, Pt, Pd, etc.), an organohydrogen silsesquioxane series photoresist, or an organic-inorganic hybrid photoresist may be used. In addition, the photosensitive photoresist may be deposited or coated on the substrate through a known method such as spin coating, deposition, or atomic layer deposition.

Next, a patterned mask is placed on a substrate coated with a photosensitive photoresist, and then exposed to a light source of a specific wavelength, an electron beam, an x-ray, etc., to form a photoresist pattern composed of an exposed portion and a non-exposed portion.

The substrate on which the photoresist pattern composed of the exposed portion and the non-exposed portion is formed through the above-described method may be placed on an electrode inside a reaction chamber of a plasma dry etching device.

The second step (S120) may include a step of modifying the surface of the photoresist pattern through a plasma deposition process using a first gas.

In an embodiment, the second step (S120) may be a step of modifying the surface of the photoresist pattern through a plasma deposition process that supplies the first gas into the reaction chamber and generates plasma. During the second step, a reaction layer may be plasma-deposited on the surface of the photoresist pattern. In an embodiment, the plasma deposition process of the second step may be performed for 0 sec to 300 sec. In addition, in the second step, the temperature of the substrate may be maintained at −50° C. or higher and 150° C. or lower.

The first gas used in the disclosure may include a reactive gas including at least one selected from the group consisting of a chlorine compound, HBr, a fluorine compound, a fluorocarbon compound, hydrogen, $NH_3$, oxygen, and nitrogen. In an embodiment, the chlorine compound includes at least one selected from the group consisting of HCl, $CCl_4$, $BCl_3$, $Cl_2$, and $SlCl_4$, the fluorine compound includes at least one selected from the group consisting of $ClF_3$, $PF_3/PF_5$, $IF_5/IF_7$, $F_2$, $SF_6$, $NF_3$, and $OF_2$, and the fluorocarbon compound may be represented as $C_xF_yH_z$ (x is an integer from 1 to 6, y is an integer from 4 to 8, and z is an integer from 0 to 4), but is not particularly limited.

In an embodiment, the reactive gas may be supplied into the reaction chamber together with an inert gas. The inert gas may include, for example, one or more selected from the group consisting of He, Ar, Kr, Xe, and Ne, but is not particularly limited. For example, the flow rate ratio of the reactive gas and the inert gas may be supplied by adjusting it to 99%:1% to 10%:90%, and the flow rate of each gas may vary depending on the size of the reaction chamber.

The third step (S130) may include a step of selectively etching a non-exposed portion of the surface-modified photoresist pattern through a plasma dry etching process using a second gas.

In an embodiment, the third step may be selectively etching a non-exposed portion of the surface-modified photoresist pattern through a plasma dry etching process that uses plasma ions (0 eV to 100 eV) with weak energy among the ions generated from the plasma by supplying a second gas into the reaction chamber to generate plasma ions and applying voltage to the electrode on which the substrate is placed. In an embodiment, in the third step, a direct current (DC) voltage of −1 V to −100 V or an RF self-bias voltage of −1 V to −100 V is applied to the electrode on which the substrate is placed.

In an embodiment, the plasma dry etching process of the third step may be performed for 0 sec to 300 sec. In addition, in the third step, the temperature of the substrate may be maintained at −50° C. or higher and 150° C. or lower.

During the third step, plasma ions may react with the plasma deposition surface layer of the surface-modified photoresist pattern and selectively etch a non-exposed portion of the photoresist pattern.

The second gas used in the disclosure may include an inert gas including at least one selected from the group consisting of He, Ar, Kr, Xe, and Ne, but is not particularly limited. Meanwhile, in an embodiment, the inert gas may be supplied into the reaction chamber alone or together with a reactive gas.

Meanwhile, the plasma dry etching method of the disclosure may further include a fourth step (S140) of purging the first gas remaining inside the reaction chamber after the second step or the third step. More specifically, the fourth step (S140) may be performed after the second step and before the third step, and the fourth step (S140) may be performed after the third step.

In addition, the disclosure may perform the cycle composed of the second step to the fourth step multiple times in order to selectively etch and remove the non-exposed portion from the substrate exposed to the plasma and implement a negative pattern in which the exposed portion remains, as shown in FIG. 3. In another embodiment, the cycle composed of the second step and the third step may be performed multiple times.

According to the plasma dry etching method of the disclosure, collapse due to surface tension and capillary force that may occur in the wet phenomenon when forming a nano-scale pattern may be prevented, and surface roughness or the like may be improved through precise reaction and removal of the reaction layer. In addition, the disclosure enables high-selectivity dry phenomenon through plasma dry etching, so that nano-scale photoresist pattern implementation is possible.

Pulse Plasma Device

FIG. 5 is a view showing a pulse plasma device of the disclosure.

Referring to FIG. 5, the pulse plasma generating device of the disclosure includes a vacuum chamber, an upper electrode disposed inside the vacuum chamber and connected to a high-frequency source power, and a lower electrode disposed opposite and spaced from the upper electrode and connected to a bias power.

The vacuum chamber may include a gas supply system that supplies plasma reaction gas into the vacuum chamber. For example, the gas supply system may include an MFC (Mass Flow Controller) and a line heater. The plasma reaction gas injected by the gas supply system may be any one gas selected from the group consisting of HBr, $BCl_3$, $Cl_2$, $O_2$, $ClF_3$, $H_2$, $N_2$, an inert gas (Ar, He, Ne, Kr, etc.), and $C_xF_yH_z$ (x is a natural number from 1 to 6, y is a natural number from 4 to 8, and z is a natural number from 1 to 4). In addition, the vacuum chamber may additionally include a vacuum pumping system to maintain the inside as a vacuum.

The upper electrode may be formed of a conductive material, and the type and form of the material formed may vary depending on the type of plasma used. For example, the plasma may be any one plasma selected from the group consisting of inductively coupled plasma (ICP), capacitively coupled plasma (CCP), and electron cyclotron resonance (ECR) plasma, and in an embodiment, the upper electrode may be a generator that generates inductively coupled plasma (ICP).

The lower electrode may generate pulse plasma from a bias power and may have a flat plate shape to support an etching target. The lower electrode may additionally include a temperature control device to control the temperature of the etching target.

The pulse plasma formation process by the pulse plasma device is as follows. The upper electrode, which receives a pulse signal from a high-frequency source power, generates pulse plasma by the pulse signal, and the lower electrode, which receives a pulse signal from a bias power, generates pulse plasma by the pulse signal. At this time, the pulse signal applied to the upper electrode and the pulse signal applied to the lower electrode are alternately turned ON to synchronize the plasma generation.

The high-frequency source power may be at least one high-frequency source power, or high-frequency source power supplies having different frequencies may be used simultaneously. The high-frequency source power may apply a high-frequency power of about 2 MHz to 100 MHz. If high-frequency source power supplies having different frequencies are used simultaneously as the high-frequency source power, for example, the high-frequency source power may use power having frequencies of about 2 MHz and 13.56 MHz simultaneously. Meanwhile, the high-frequency source power may be applied with a power of about 1 W to 5 kW.

The bias power may be energized to generate pulse plasma in synchronization with the high frequency source power. The bias power may be a direct current (DC) power, an alternating current power (one high frequency power), or power supplies with different frequencies may be used simultaneously. The bias power may be energized at about 400 kHz to 60 MHz. If power supplies with different frequencies are used simultaneously as the bias power, for example, power supplies with frequencies of about 2 MHz and 13.56 MHz may be used simultaneously. Meanwhile, the bias power may be applied with a power of about 1 W to 300 W.

Dry Etching Method Using Pulse Plasma

FIG. 6 and FIG. 7 are drawings for explaining a dry etching method using pulse plasma of the disclosure.

First, referring to FIG. 6, a dry etching method using a pulse plasma device comprising a vacuum chamber, an upper electrode positioned inside the vacuum chamber and connected to a high-frequency source power, and a lower electrode positioned spaced apart from the upper electrode and connected to a bias power includes: a first step of positioning a substrate on which a photoresist pattern composed of an exposed portion and a non-exposed portion is formed on the lower electrode; a second step of injecting a plasma reaction gas into the vacuum chamber; and a third step of applying a pulse signal of a first AC voltage and a pulse signal of a second AC or DC voltage synchronized with each other to the upper electrode and the lower electrode, respectively, to form a pulse plasma inside the vacuum chamber to selectively etch a non-exposed portion of the photoresist pattern of the substrate.

The disclosure is characterized in that, in the third step, etching is performed by pulse plasma generated by a pulse signal of a first AC voltage and a pulse signal of a second AC or DC voltage, respectively, and etching by plasma may be controlled by controlling the pulse signal according to the frequency, operation delay time, operation ratio, etc. of the pulse signal of the first AC voltage and the pulse signal of the second AC or DC voltage.

Referring to FIG. 7, the pulse signal of the disclosure will be specifically described.

Referring to FIG. 7, in the third step, the pulse signal of the first AC voltage and the pulse signal of the second AC or DC voltage have the same cycle, the pulse signal of the first AC voltage has a first application cycle composed of a first ON time and a first OFF time, the pulse signal of the second AC or DC voltage has a second application cycle composed of a second ON time and a second OFF time, and has the same second application cycle as the first application cycle, the second ON time is at least a part of the first OFF time, and the first ON time is at least a part of the second OFF time.

In an embodiment, the frequency of the pulse signal of the first AC voltage and the pulse signal of the second AC or DC voltage may be about 0.01 Hz to 100 kHz. The frequency of the first AC voltage may be 2 to 100 MHZ, and the frequency of the second AC or DC voltage may be 400 kMz to 60 MHz.

The operation delay time (delay time) of the pulse signal means the time from the time when the first ON time of the pulse signal of the first AC voltage ends to the time when the second ON time of the pulse signal of the second AC or DC voltage starts, and in an embodiment of the disclosure, the operation delay time between the first ON time of the pulse signal of the first AC voltage and the second ON time of the pulse signal of the second AC or DC voltage may be 0 to 100 seconds.

Meanwhile, the operation ratio (Duty Ratio, %) of the pulse signal may be expressed as follows.

$$\text{Duty Ration}(\%) = \frac{\text{First On time or Second On time (sec)}}{\text{Pulse signal period}} \times 100$$

In an embodiment, an operation ratio of the pulse signal of the first AC voltage may be 1 to 100%, and an operation ratio of the pulse signal of the second AC or DC voltage may be 1 to 100%. Preferably, the operation ratio of the pulse signal of the first AC voltage may be 20 to 40%, and the operation ratio of the pulse signal of the second AC or DC voltage may be 40 to 80%.

At the second ON time of the pulse signal of the second AC or DC voltage, the self-bias voltage of the pulse signal of the second AC or DC voltage may be −1 to −200 V. The self-bias voltage ($V_{ave\ @\ on}$) refers to the magnitude of the voltage generated when the substrate is negatively charged due to the mass difference between electrons and positive ions in the plasma when the second AC voltage is applied. In the disclosure, the self-bias may refer to a negative voltage value generated when the pulse signal is ON, that is, when RF is applied, by applying the second AC voltage as a pulse. When the pulse signal is OFF, the self-bias may be >0 V.

Referring again to FIG. 6, in the third step, the disclosure is characterized in that when the pulse signal of the first AC voltage is the first ON time and the pulse signal of the second AC or DC voltage is the second OFF time, radicals generated by the plasma are adsorbed on the non-exposed portion of the photoresist pattern of the substrate. At this time, the energy of the ions incident on the substrate is very small (<30 eV) to remove the photoresist, so that no etching of the photoresist occurs or occurs very little. Thereafter, when the pulse signal of the first AC voltage is the first OFF time and the pulse signal of the second AC or DC voltage is the second ON time, the non-exposed portion is etched due to high-energy ions colliding with the substrate. At this time, the energy of the ions incident on the substrate is different depending on the size of the second AC or DC voltage.

FIG. 8 is a view for explaining a substrate on which a photoresist pattern composed of an exposed portion and a non-exposed portion is formed according to an embodiment of the disclosure.

Referring to FIG. 8, the substrate on which the photoresist pattern of the disclosure is formed includes a photoresist coating step of forming a photoresist layer on the substrate and a pattern forming step of forming a pattern on the photoresist layer.

The photoresist layer may be formed with a photosensitive photoresist, and may be, for example, one selected from a metal organic cluster photoresist (metal=Sn, Zn, Zr, Hf, Pt, Pd), an organohydrogen silsesquioxane series photoresist, and an organic/inorganic hybrid photoresist.

In the coating step, the formation of the photoresist layer may be performed by coating a photoresist solution on the substrate. For example, the coating may be performed by one coating method selected from spin coating, evaporation coating, and atomic layer deposition (ALD). However, this is not necessarily limited thereto, and any method capable of forming a photoresist layer on the substrate may be used.

The pattern forming step may be formed by placing a pattern structure on top of a photoresist layer and exposing it to a light source of a specific wavelength. For example, the light source may be any one selected from EUV (13.5 nm), ArF (193 nm), KrF (248 nm), electron beam, and X-ray, but is not necessarily limited thereto.

Hereinafter, embodiments of the disclosure will be described in detail. However, the embodiments described below are only partial embodiments of the disclosure, and the scope of the disclosure is not limited to the following embodiments.

Embodiment 1

A pattern was formed on the substrate by exposing a photoresist in the form of Tin Oxo-cluster. Thereafter, the substrate with the pattern formed was placed on the electrode inside the reaction chamber of an ICP type plasma dry etching device.

Next, $Bcl3_3$ and Ar gases were injected into the reaction chamber at a flow rate ratio of 35 sccm:10 sccm, and a plasma deposition process was performed to expose the substrate to plasma by discharging under the conditions of 5 mtorr, ICP source (13.56 MHz, 400 W), and electrode temperature of 70° C.

Thereafter, BCl3 and Ar gases were injected into the reaction chamber at a flow rate ratio of 35 sccm:10 sccm, and discharged under the conditions of 5 mtorr, ICP source (13.56 MHz, 400 W), and electrode temperature 70° C. to generate plasma, and a voltage of 12.56 MHz DCave=−5 V was applied to the electrode to remove the plasma-deposited layer through plasma ions (0 eV to 100 eV) with weak energy among the ions generated from the plasma, and selective plasma dry etching was performed.

The process above was performed as one cycle, and plasma dry etching was performed until the non-exposed portion was removed.

<Analysis Result>

FIG. 4A shows an optical microscope image of a photoresist pattern before/after a plasma deposition process in a plasma dry etching method according to an embodiment of the disclosure ((a) non-exposed portion, (b) exposed portion), FIG. 4B shows an optical microscope image of a photoresist pattern before/after a plasma dry etching process ((a) non-exposed portion, (b) exposed portion), and FIG. 4C shows the result of performing the plasma deposition process and the plasma dry etching process repeatedly several times.

Referring to FIG. 4A, it is possible to confirm that a $BCl_x$ layer is formed on the top of the non-exposed portion (a) and the exposed portion (b) after the plasma deposition process. This confirms that the photoresist pattern has been surface modified by the plasma deposition process.

Referring to FIG. 4B, it is possible to confirm that the non-exposed portion (a) is removed after the plasma dry etching process, and only the exposed portion (b) remains. In addition, referring to FIG. 4C, it is possible to confirm that the 50 μm line pattern is implemented in a negative tone as a result of repeatedly performing the plasma deposition process and the plasma dry etching process several times, as an alpha step. That is, the negative tone dry etching result in which the non-exposed portion is removed and the exposed portion remains was confirmed.

Although the disclosure has been described above with reference to preferred embodiments thereof, it will be understood by those skilled in the art that various modifications and changes may be made to the disclosure without departing from the spirit and scope of the disclosure as set forth in the claims below.

Embodiment 2

After exposing a photoresist in the form of Tin Oxo-cluster to form a pattern on a substrate, the substrate was placed on a lower electrode using a pulse plasma device that forms an ICP type plasma, and $BCl_3$ and Ar gases were injected into the chamber, and then exposed to pulse plasma to etch the pattern. The results are shown in FIGS. 9 and 10.

The specific experimental conditions are as follows: $BCl_3$:Ar=10 sccm:40 sccm, 5 mtorr, ICP source (13.56 MHz, 400 W), $DC_{ave}$=−50 V when the pulse of the second electrode (12.56 MHZ) is on, the temperature of the lower electrode is 70° C., the pulse period is 1 kHz, the operation ratio of the pulse signal of the first AC voltage (Source pulse duty) is 30%, and the operation ratio of the pulse signal of the second AC or DC voltage (bias pulse duty) is 70%.

Referring to FIG. 9, it is possible to confirm that only the non-exposed portion of the photoresist pattern of the substrate is selectively etched after dry etching. Therefore, it has been proven through the disclosure that it is possible to selectively etch only the non-exposed portion.

Referring to FIG. 10, the result of confirming whether the 50 μm line pattern was implemented in a negative tone using alpha step is shown. Through the result, it was confirmed that the non-exposed portion of the photoresist was removed and the exposed portion remained as a negative tone dry development result.

Although the disclosure has been described above with reference to preferred embodiments thereof, it will be understood by those skilled in the art that various modifications and changes may be made to the disclosure without departing from the spirit and scope of the disclosure as set forth in the claims below.

EXPLANATION OF REFERENCE NUMERALS

10: Plasma dry etching device
110: Reaction chamber
120: First electrode
130: Second electrode
140: Gas supply unit

What is claimed is:

1. A plasma dry etching method comprising:

a first step of placing a substrate having a photoresist pattern formed thereon, which is composed of an exposed portion and a non-exposed portion, on an electrode inside a reaction chamber of a plasma dry etching device;

a second step of modifying the surface of the photoresist pattern through a plasma deposition process using a first gas; and a third step of selectively etching the non-exposed portion or exposed portion of the surface-modified photoresist pattern through a plasma dry etching process using a second gas.

2. The plasma dry etching method of claim 1, wherein the first gas comprises a reactive gas comprising at least one selected from the group consisting of chlorine compounds, HBr, fluorine compounds, fluorocarbon compounds, hydrogen, $NH_3$, oxygen, and nitrogen.

3. The plasma dry etching method of claim 2, wherein the chlorine compound comprises at least one selected from the group consisting of HCl, $CCl_4$, $BCl_3$, $Cl_2$, and $SiCl_4$, the fluorine compound comprises at least one selected from the group consisting of $ClF_3$, $PF_3/PF_5$, $IF_5/IF_7$, $F_2$, $SF_6$, $NF_3$, and $OF_2$, and the fluorocarbon compound is represented by CxFyHz (x is an integer from 1 to 6, y is an integer from 4 to 8, and z is an integer from 0 to 4).

4. The plasma dry etching method of claim 2, wherein the reactive gas is supplied into the reaction chamber together with an inert gas.

5. The plasma dry etching method of claim 1, wherein the second gas comprises an inert gas including at least one selected from the group consisting of He, Ar, Kr, Xe and Ne.

6. The plasma dry etching method of claim 1, wherein the third step comprises a process of supplying the second gas into the reaction chamber to generate plasma ions and applying a voltage to an electrode on which a substrate is placed to selectively etch a non-exposed portion of a surface-modified photoresist pattern through the plasma ions.

7. The plasma dry etching method of claim 6, wherein in the third step, a direct current (DC) voltage of −1 V to −100 V or an RF self-bias voltage of −1 V to −100 V is applied to the electrode on which the substrate is placed.

8. The plasma dry etching method of claim 1, wherein in the second and third steps, the temperature of the substrate is maintained at −50° C. or higher and 150° C. or lower.

9. The plasma dry etching method of claim 1, further comprising a fourth step of purging the first gas remaining inside the reaction chamber after the second step or the third step.

10. The plasma dry etching method of claim 9, wherein a cycle composed of the second to fourth steps is performed multiple times.

11. A dry etching method using a pulse plasma device comprising a vacuum chamber, an upper electrode positioned inside the vacuum chamber and connected to a high-frequency source power, and a lower electrode positioned spaced apart from the upper electrode and connected to a bias power, the method comprising:

a first step of positioning a substrate on which a photoresist pattern composed of an exposed portion and a non-exposed portion is formed on the lower electrode;

a second step of injecting a plasma reaction gas into the vacuum chamber; and a third step of applying a pulse signal of a first AC voltage and a pulse signal of a second AC or DC voltage synchronized with each other to the upper electrode and the lower electrode, respectively, to form a pulse plasma inside the vacuum chamber to selectively etch a non-exposed portion of the photoresist pattern of the substrate, wherein the pulse signal of the first AC voltage has a first application period composed of a first ON time and a first OFF time, the pulse signal of the second AC or DC voltage has a second application period composed of a second ON time and a second OFF time, and an operation delay time between the first ON time of the pulse signal of the first AC voltage and the second ON time of the pulse signal of the second AC or DC voltage is 0 to 100 seconds.

12. The dry etching method using a pulse plasma device of claim 11, wherein the first application period of the pulse signal of the first AC voltage and the second application period of the pulse signal of the second AC or DC voltage are the same, the second ON time is at least a part of the first OFF time, and the first ON time is at least a part of the second OFF time.

13. The dry etching method using a pulse plasma device of claim 12, wherein an operation ratio of the pulse signal of the first AC voltage is 1 to 100%, and an operation ratio of the pulse signal of the second AC or DC voltage is 1 to 100%.

14. The dry etching method using a pulse plasma device of claim 13, wherein an operation ratio of the pulse signal of the first AC voltage is 20 to 40%, and an operation ratio of the pulse signal of the second AC or DC voltage is 40 to 80%.

15. The dry etching method using a pulse plasma device of claim 11, wherein the frequency of the pulse signal of the first AC voltage and the pulse signal of the second AC or DC voltage is 0.01 Hz to 100 KHz.

16. The dry etching method using a pulse plasma device of claim 11, wherein the frequency of the first AC voltage is 2 MHz to 100 MHz, and the frequency of the second AC or DC voltage is 400 kHz to 60 MHz.

17. The dry etching method using a pulse plasma device of claim 11, wherein a plasma generating device generates any one plasma selected from the group consisting of inductively coupled plasma (ICP), capacitively coupled plasma (CCP), and electron cyclotron resonance (ECR) plasma.

18. The dry etching method using a pulse plasma device of claim 11, wherein the bias power is a DC or RF power.

19. The dry etching method using a pulse plasma device of claim 11, wherein a self-bias voltage of the pulse signal of the second AC or DC voltage is −1 to −200 V.

20. The dry etching method using a pulse plasma device of claim 11, wherein the high frequency source power is 1 W to 5 KW, and the bias power is 1 W to 300 W.

21. The dry etching method using a pulse plasma device of claim 11, wherein the reaction gas is one selected from the group consisting of HBr, HCl, $CCl_4$, $BCl_3$, $Cl_2$, $O_2$, ClF, $ClF_3$, $PF_3/PF_5$, $IF_5/IF_7$, $F_2$, $H_2$, $N_2$, Ar, He, Ne, Kr, and $C_xF_yH_z$ (x is a natural number from 1 to 6, y is a natural number from 4 to 8, and z is a natural number from 1 to 4).

22. The dry etching method using a pulse plasma device of claim 11, wherein in the third step, when the pulse signal of the first AC voltage is the first ON time and the pulse signal of the second AC or DC voltage is the second OFF time, radical ions generated by the plasma are adsorbed on the non-exposed portion of the photoresist pattern of the substrate, and when the pulse signal of the first AC voltage is the first OFF time and the pulse signal of the second AC or DC voltage is the second ON time, the ions of the non-exposed portion are desorbed and the non-exposed portion is etched.

* * * * *